US012615012B1

(12) United States Patent
Moncada

(10) Patent No.:     US 12,615,012 B1
(45) Date of Patent:     Apr. 28, 2026

(54) LINEARLY CORRUGATED PANEL SYSTEM FOR SOLAR PANELS AND OTHER RADIATION-BASED APPLICATIONS

(71) Applicant: Armando Moncada, Honolulu, HI (US)

(72) Inventor: Armando Moncada, Honolulu, HI (US)

( * ) Notice: Subject to any disclaimer, the term of this patent is extended or adjusted under 35 U.S.C. 154(b) by 0 days.

(21) Appl. No.: 19/360,348

(22) Filed: Oct. 16, 2025

Related U.S. Application Data

(60) Provisional application No. 63/837,320, filed on Jul. 2, 2025.

(51) Int. Cl.
*H02S 40/42*          (2014.01)
*H02S 40/22*          (2014.01)
*H10F 77/70*          (2025.01)

(52) U.S. Cl.
CPC .............. *H02S 40/42* (2014.12); *H02S 40/22* (2014.12); *H10F 77/703* (2025.01)

(58) Field of Classification Search
CPC .......... H02S 40/22; H02S 40/42; H10F 77/14; H10F 77/147; H10F 77/70–703; H10F 77/40–42; H10F 77/48; H10F 77/93–955; H10F 77/223–227; H10F 19/90–908; H10F 19/70–75
See application file for complete search history.

(56) References Cited

U.S. PATENT DOCUMENTS

| | | | | | |
|---|---|---|---|---|---|
| 3,152,926 | A | * | 10/1964 | Power | H10F 77/147 |
| | | | | | 136/246 |
| 3,278,337 | A | * | 10/1966 | Gault | H10F 77/148 |
| | | | | | 257/459 |
| 4,608,451 | A | * | 8/1986 | Landis | H10F 77/48 |
| | | | | | 257/466 |
| 4,626,613 | A | * | 12/1986 | Wenham | H10F 77/703 |
| | | | | | 257/466 |
| 5,024,953 | A | * | 6/1991 | Uematsu | H10F 77/488 |
| | | | | | 257/E23.179 |
| 5,248,621 | A | * | 9/1993 | Sano | H10F 77/703 |
| | | | | | 148/DIG. 12 |
| 6,534,336 | B1 | * | 3/2003 | Iwane | H10F 77/703 |
| | | | | | 257/E31.13 |
| 2011/0045627 | A1 | * | 2/2011 | Sachs | H10F 77/703 |
| | | | | | 257/E31.13 |

(Continued)

*Primary Examiner* — Andrew J Golden
(74) *Attorney, Agent, or Firm* — Plager Schack LLP; Mark H. Plager; Kara K. Verryt

(57)          ABSTRACT
A panel structure for increasing efficiency in a panel system may include a panel substrate with a plurality of conductive bridges positioned therein and extending between a top surface of the panel substrate and a bottom surface of the panel substrate; a linearly corrugated layer attached to the top surface of the panel substrate, wherein the linearly corrugated layer includes a pair of top wire channels therein, the top wire channels being aligned with the conductive bridges; a pair of top wires positioned within the top wire channels and operatively engaged with the conductive bridges; and a pair of bottom wires positioned on the bottom surface of the panel substrate, the bottom wires being operatively engaged with the conductive bridges. The system may also include a dielectric paint layer applied between the panel substrate and the linearly corrugated layer.

7 Claims, 4 Drawing Sheets

(56) References Cited

U.S. PATENT DOCUMENTS

| 2011/0146794 A1* | 6/2011 | Tsai | ....................... | H10F 77/315 |
| | | | | 438/69 |
| 2012/0097210 A1* | 4/2012 | Jang | ..................... | H10F 19/908 |
| | | | | 136/244 |
| 2012/0234388 A1* | 9/2012 | Stancel | ................... | H10F 19/75 |
| | | | | 257/E31.11 |

* cited by examiner

LINEARLY CORRUGATED PANEL SYSTEM FOR SOLAR PANELS AND OTHER RADIATION-BASED APPLICATIONS

RELATED APPLICATION

This application claims priority to provisional patent application U.S. Ser. No. 63/837,320 filed on Jul. 2, 2025, the entire contents of which is herein incorporated by reference.

BACKGROUND

The embodiments described herein relate generally to power generation and cooling panels and, more particularly, to a linearly corrugated panel system for solar panels and other radiation based applications, such as night-sky radiative cooling panels.

Existing solar panel designs are typically flat and are exposed to light only once. Moreover, it is very normal for solar panel systems to have limited space for installation. Since watts are proportion to available installation area, the possibility for an installation to achieve its desired wattage or a higher wattage is limited by the size of the installation area. On typical panels, the maximum amount of watts/ meter$^2$ reaches a maximum of 1000×efficiency of the panel.

Therefore, what is needed is a panel design that can increase the total maximum watts/square foot that a panel system, such as a solar panel system or a cooling panel system, can achieve.

SUMMARY

Some embodiments of the present disclosure include a panel structure for increasing efficiency in a panel system. The panel structure may include a panel substrate with a plurality of conductive bridges positioned therein and extending between a top surface of the panel substrate and a bottom surface of the panel substrate; a linearly corrugated layer attached to the top surface of the panel substrate, wherein the linearly corrugated layer includes a pair of top wire channels therein, the top wire channels being aligned with the conductive bridges; a pair of top wires positioned within the top wire channels and operatively engaged with the conductive bridges; and a pair of bottom wires positioned on the bottom surface of the panel substrate, the bottom wires being operatively engaged with the conductive bridges. The system may also include a dielectric paint layer applied between the panel substrate and the linearly corrugated layer, in the event that the ceramic substrate is subbed for a conductive non-dielectric substrate. Using the panel structure may provide for a projected improvement in efficiency of, for example, about 27% as compared to non-linearly corrugated panels.

BRIEF DESCRIPTION OF THE FIGURES

The detailed description of some embodiments of the invention is made below with reference to the accompanying figures, wherein like numerals represent corresponding parts of the figures.

DETAILED DESCRIPTION

In the following detailed description of the invention, numerous details, examples, and embodiments of the invention are described. However, it will be clear and apparent to one skilled in the art that the invention is not limited to the embodiments set forth and that the invention can be adapted for any of several applications.

The device of the present disclosure may be used as a panel structure for increasing efficiency in panel systems, such as solar panel systems and cooling panel systems, and may comprise the following elements. This list of possible constituent elements is intended to be exemplary only, and it is not intended that this list be used to limit the device of the present application to just these elements. Persons having ordinary skill in the art relevant to the present disclosure may understand there to be equivalent elements that may be substituted within the present disclosure without changing the essential function or operation of the device.

The various elements of the present disclosure may be related in the following exemplary fashion. It is not intended to limit the scope or nature of the relationships between the various elements, and the following examples are presented as illustrative examples only.

Figure 1:
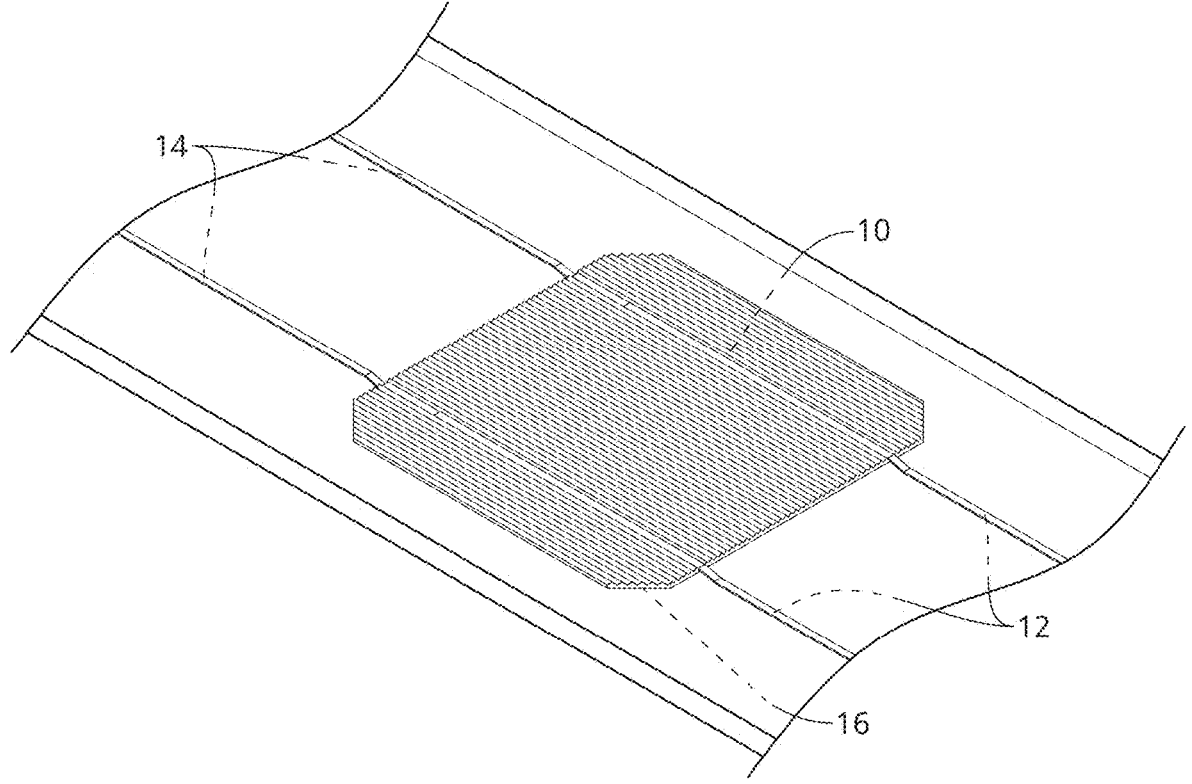
FIG. 1 is a perspective view of one embodiment of the present disclosure.
Figure 2:
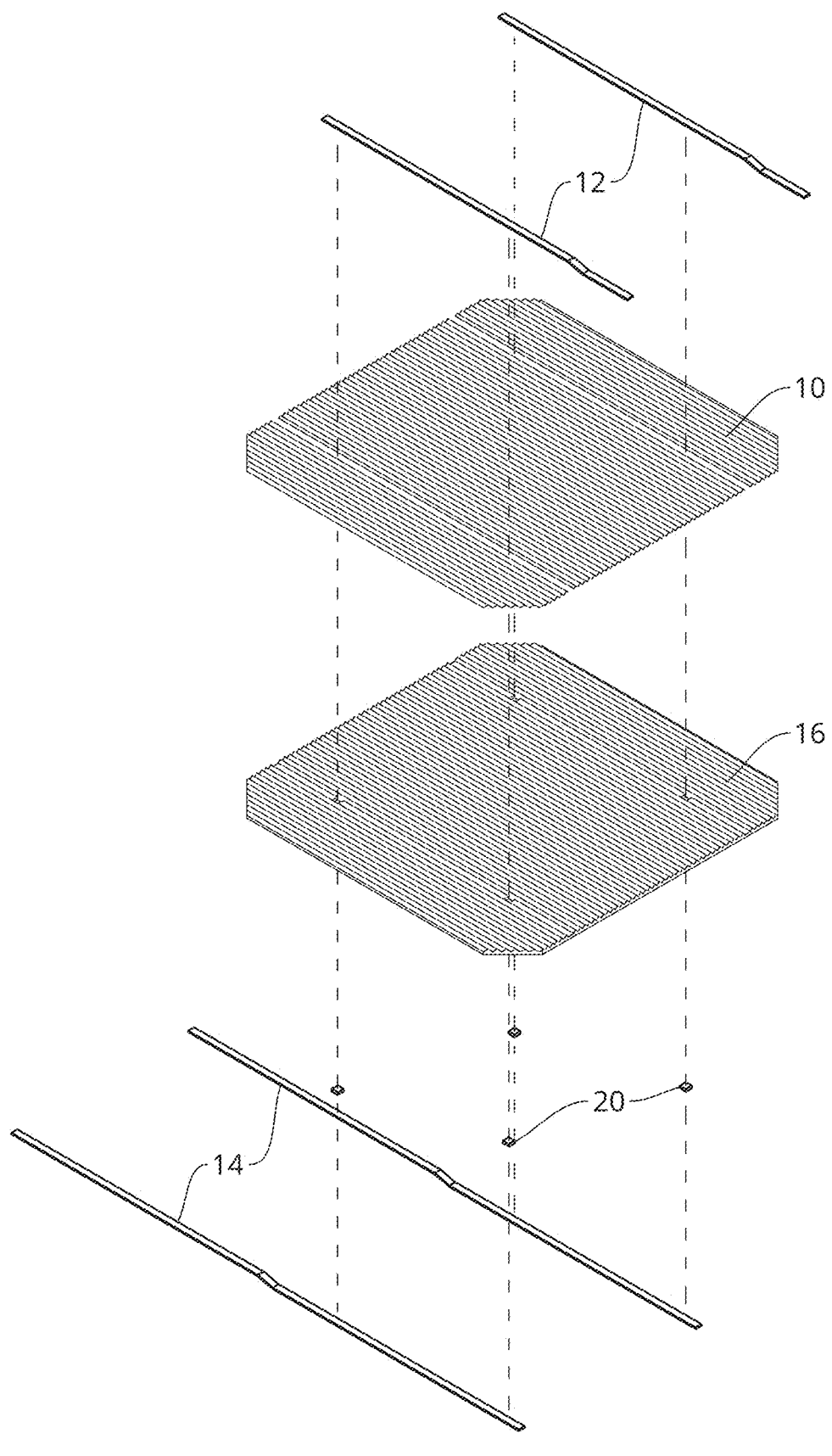
FIG. 2 is a top perspective exploded view of one embodiment of the present disclosure.
Figure 3:
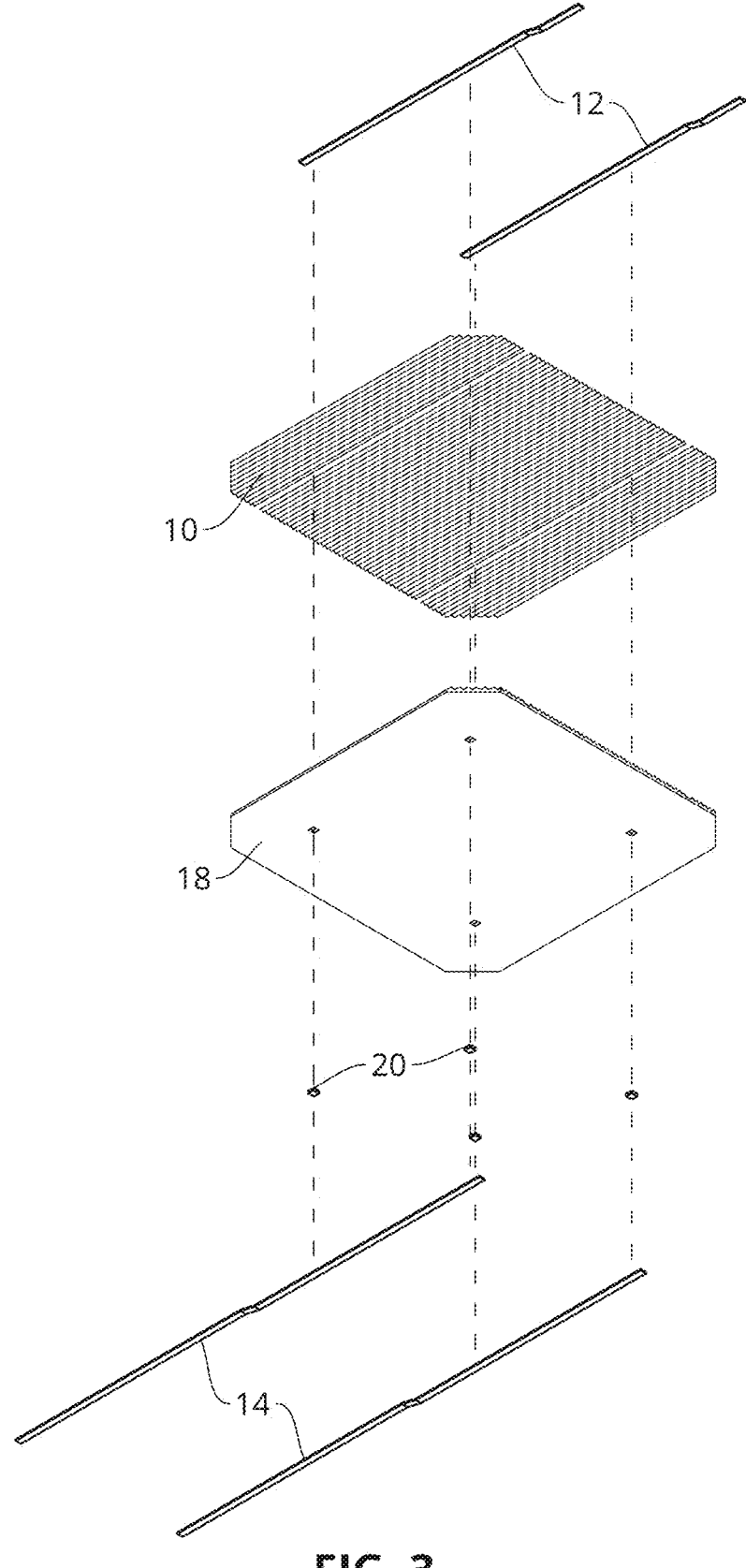
FIG. 3 is a bottom perspective exploded view of one embodiment of the present disclosure.
Figure 4:
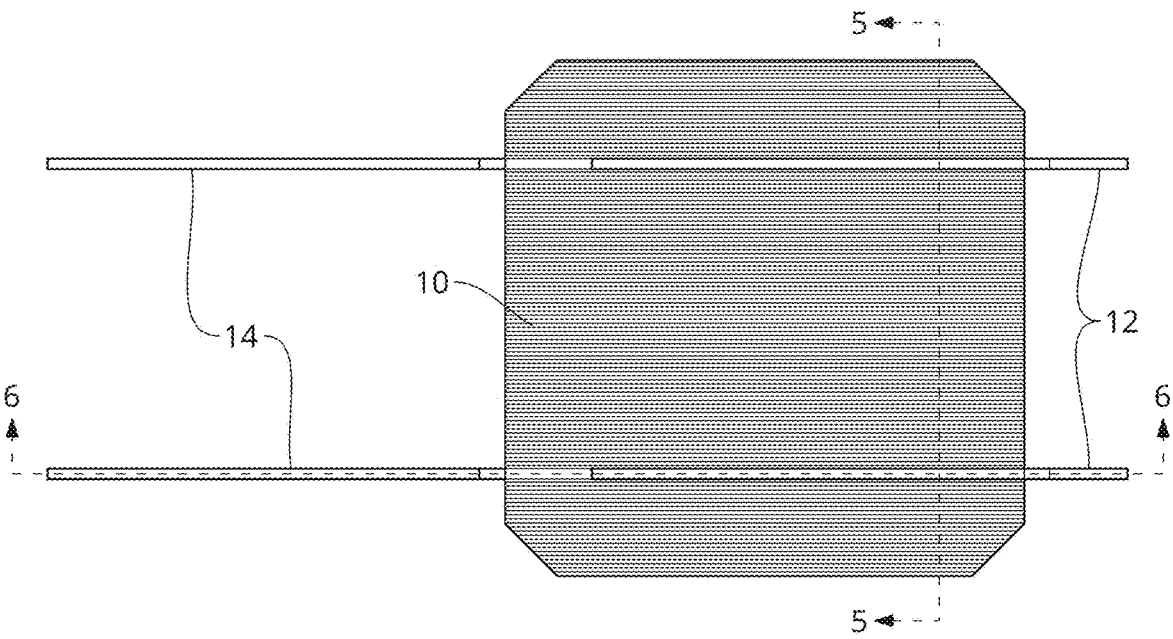
FIG. 4 is a top view of one embodiment of the present disclosure.
Figure 5:
FIG. 5 is a section view of one embodiment of the present disclosure, taken along line 5-5 in FIG. 4.
Figure 6:
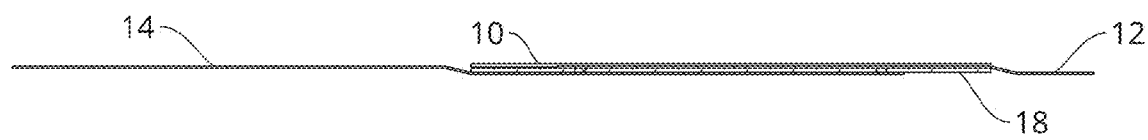
FIG. 6 is a section view of one embodiment of the present disclosure, taken along line 6-6 in FIG. 4.

By way of example, and referring to FIGS. 1-6, some embodiments of the present disclosure include a panel structure for increasing efficiency in a panel system, such as solar panel systems and cooling panel systems, the panel structure comprising a panel substrate 18 with a plurality of conductive bridges 20 positioned therein and extending between a top surface of the panel substrate 18 and a bottom surface of the panel substrate 18; a linearly corrugated silicon layer 10 attached to the top surface of the panel substrate 18, wherein the linearly corrugated silicon layer 10 includes a pair of top wire channels therein, the top wire channels being aligned with the conductive bridges 20; a pair of top wires 12 positioned within the top wire channels and operatively engaged with the conductive bridges 20; a dielectric paint 16 applied between the panel substrate 18 and the linearly corrugated silicon layer 10; and a pair of bottom wires 14 positioned on the bottom surface of the panel substrate 18, the bottom wires 14 being operatively engaged with the conductive bridges 20. As shown in the Figures, the top wires 12 and the bottom wires 14 may extend beyond the edges of the panel substrate 18 and may be substantially parallel to the linear corrugation pattern on the linearly corrugated silicon layer 10. While not shown in the Figures, in some embodiments, the panel structure may be fully enclosed in an acrylic sheet via plastic resin casting, wherein the acrylic enclosure may be structurally mounted to roof brackets and to the roof using, for example, conventional fasteners, like nuts and bolts. In other embodiments, the roof brackets may be entirely acrylic as well to lower costs without compromising functionality.

The components of the panel structure of the present disclosure may be made of any suitable materials. For example, and as mentioned above, the linearly corrugated layer 10 may comprise silicon. The corrugated surface may comprise, for example, 45 degree angles. The panel substrate 18 may comprise, for example, ceramic or quartz. In some embodiments, the substrate may be dielectric by default with a very high dielectric strength. In such cases, the dielectric paint layer may not be necessary. Rather, the dielectric paint layer may be present when the substrate is of low dielectric strength or is non-dielectric altogether, but if the substrate is dielectric, as most ceramics are, then there may not be a need for a dielectric paint layer. In some instances, the substrate may be translucent, and in such cases, there may be a need for the dielectric paint layer even if the substrate is dielectric. In summary, if the substrate is dielectric and opaque, the dielectric paint layer may not be needed.

The wiring may comprise a metal with a melting temperature well above the annealing temperature of silicon, wherein the resistivity may be less than that of copper wire. If steel is used, then a lower resistivity can be achieved by widening the width and height of the wiring or combining the steel with carbon/graphene.

Due to the panel structure of the present disclosure, light reflects off of the corrugated surface, which if the sun is normal to the panel structure, the silicon surface would be at a 45-degree angle to the incoming rays of light. These rays of light will bounce off the 45-degree angled surface and hit the next adjacent surface. Then, more light hits the solar panel, increasing the wattage per square foot of the total system, before finally being reflected a second time, this time away from the panel. As such, the system employs a double bounce, enabling the efficiency to automatically be increased by more than 25%. Therefore, a 200 watt per meter$^2$ panel, if using the panel of the present disclosure, would achieve 250 watts per meter$^2$ automatically because of the light bouncing twice on the panel. The increase in energy may be calculated by: 100%*cos(45)*+80%*cos(45) =90%*2*cos(45)=1.27 increase in efficiency. The 100% represents the intensity of the light on the first bounce, and 80% represents the intensity of the light on the second bounce, providing 90% average intensity for both surfaces.

To create the panel structure of the present disclosure, the panel substrate 18 may be provided, and the linearly corrugated layer 10 may be sprayed thereon. When the ceramic dielectric paint 16 is applied and the bottom wires 14 have been added, the assembly may be nearly finished but is polycrystalline. Annealing the panel structure may change the silicon to monocrystalline, resulting in an increase in efficiency. Annealing may also increase the amount of carbon-to-carbon bonds and increase conductivity as graphene forms in the wiring system. In some embodiments, the panel assembly may then be surrounded by acrylic as a final enclosure and protective structure. At this point, the panel is ready to be mounted onto a roof using, for example, a bracket mounting system.

While the above description is directed to using the linearly corrugated panels in solar systems and radiative cooling systems, such as in night sky cooling panel systems, the panels may also be used in communications systems, such as satellite systems and telecommunication towers.

The above-described embodiments of the invention are presented for purposes of illustration and not of limitation. While these embodiments of the invention have been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. A panel structure for increasing efficiency in a panel system, the panel structure comprising:
   a panel substrate with a plurality of conductive bridges positioned therein and extending between a top surface of the panel substrate and a bottom surface of the panel substrate, the panel substrate having a corrugated top surface with a corrugation pattern and a planar bottom surface;
   a linearly corrugated layer attached to the top surface of the panel substrate, wherein the linearly corrugated layer includes a pair of top wire channels extending entirely therethrough, the top wire channels being aligned with the conductive bridges, such that the top wire channels are parallel with an elongate length of the corrugation pattern;
   a pair of top wires positioned within the top wire channels and operatively engaged with the conductive bridges; and
   a pair of bottom wires positioned on the bottom surface of the panel substrate, the bottom wires being operatively engaged with the conductive bridges.

2. The panel structure of claim 1, wherein the linearly corrugated layer is a silicon layer.

3. The panel structure of claim 2, wherein silicon layer is monocrystalline.

4. The panel structure of claim 1, further comprising a dielectric paint applied between the panel substrate and the linearly corrugated layer.

5. The panel structure of claim 1, wherein the pair of top wires and the pair of bottom wires each extend beyond outer edges of the panel substrate and are substantially parallel to a linear corrugation pattern on the linearly corrugated layer.

6. The panel structure of claim 1, wherein the linearly corrugated layer comprises 45 degree angles.

7. The panel structure of claim 1, wherein the linearly corrugated layer comprises angles that provide for at least a double bounce of light.

* * * * *